United States Patent [19]

Masumoto et al.

[11] Patent Number: 5,208,492

[45] Date of Patent: May 4, 1993

[54] OUTPUT BUFFER USER-PROGRAMMABLE TO FUNCTION AS CMOS OUTPUT DRIVER OR OPEN-DRAIN OUTPUT DRIVER

[75] Inventors: Hiroaki Masumoto; Shigemi Chimura, both of Kyoto, Japan

[73] Assignee: Rohm Co., Ltd., Kyoto, Japan

[21] Appl. No.: 831,538

[22] Filed: Feb. 5, 1992

[30] Foreign Application Priority Data

Feb. 7, 1991 [JP] Japan .................. 3-038151

[51] Int. Cl.$^5$ .......................................... H03K 19/094
[52] U.S. Cl. ................................ 307/469; 307/443;
307/451; 307/296.7
[58] Field of Search ............... 307/443, 457, 465, 469,
307/473, 475, 296.7, 303.2; 361/91

[56] References Cited

U.S. PATENT DOCUMENTS

| | | | |
|---|---|---|---|
| 4,223,277 | 9/1980 | Taylor | 307/443 X |
| 4,481,432 | 11/1984 | Davies, Jr. | 307/469 |
| 4,593,203 | 6/1986 | Iwahashi et al. | 307/469 X |
| 4,593,279 | 6/1986 | Leach et al. | 340/811 |
| 4,707,623 | 11/1987 | Bismarck | 307/475 |
| 4,992,679 | 2/1991 | Takata et al. | 307/465 |

Primary Examiner—David R. Hudspeth
Attorney, Agent, or Firm—Fay, Sharpe, Beall, Fagan, Minnich & McKee

[57] ABSTRACT

The improved CMOS output circuit has an enhancement-type PMOS and an enhancement-type NMOS connected in order between a power supply line and a reference potential line and that has the junction between the PMOS and the NMOS connected to an output terminal. The PMOS is such that a P-type region is provided in the back gate region to form a diode, with the back gate region being connected to the power supply line via the diode. A switch circuit is inserted between the gate of this PMOS and said junction or the output terminal. When a voltage higher than the voltage on the power supply line is applied to the output terminal, the applied voltage will turn on the switch circuit.

10 Claims, 3 Drawing Sheets

OUTPUT BUFFER USER-PROGRAMMABLE TO FUNCTION AS CMOS OUTPUT DRIVER OR OPEN-DRAIN OUTPUT DRIVER

BACKGROUND OF THE INVENTION

1. Technical Field

This invention relates to an IC output circuit, more particularly, to a CMOS output circuit that permits switching between a CMOS output and an N-channel open drain output after it is fabricated as a complete IC product.

2. Background Art

A conventional output circuit for ICs such as a one-chip microcomputer that is capable of switching between a CMOS output and an N-channel open drain output is shown in FIG. 4. Transistor $DT_1$ is an N-channel MOSFET (hereunder abbreviated as "NMOS"). To insure that the output circuit will produce a CMOS output, a depletion layer is formed under the gate of transistor $DT_1$ in the IC fabrication process. As shown in FIG. 4, the gate of $DT_1$ is grounded so that transistor $DT_1$ will operate as a depletion-type MOSFET. Although its gate is at the ground potential, transistor $DT_1$ is shorted between the source and the drain, whereby the circuit shown in FIG. 4 will produce a CMOS output.

If one wants to insure that the output circuit will produce an open drain output, no depletion layer is formed under the gate of transistor $DT_1$ in the IC fabrication process but the gate is grounded, whereby transistor $DT_1$ will operate as an enhancement-type MOSFET. Since the potential of the grounded gate is zero volts, transistor $DT_1$ will turn off. As a result, the circuit shown in FIG. 4 will produce an N-channel open drain output. In this case, no current will flow from an output terminal 12 to the power supply, so even if the voltage at the output terminal becomes higher than a supply voltage $V_{DD}$ on the IC side, the latter voltage will not be increased. Hence the output circuit shown in FIG. 4 can be used as an output port having high withstand voltage.

Transistor $DT_1$ may be designed as a circuit that performs switching between a CMOS output and an open-drain output by the ON-OFF control of the enhancement-type MOSFET; however, in this case, the high level of the CMOS output (hereunder abbreviated as "H") will not increase to the supply voltage, making it difficult for the output current to flow.

The output circuit of the type described above has the following additional problems. First, selection between a CMOS output and an open-drain output depends entirely upon the formation of a depletion layer under the gate of transistor $DT_1$. In other words, the type of output to be produced is determined at the stage of fabrication and cannot be changed once a complete IC product is fabricated.

In order to avoid this difficulty, it has been proposed to design an open-drain output circuit that does not use transistor $DT_1$ but which is operated by merely turning off a PMOS transistor $Q_1$. However, if a voltage higher than the supply voltage $V_{DD}$ is applied to the output terminal 12, a parasitic diode in transistor $Q_1$ will cause a current to flow from the drain of transistor $Q_1$ to the power supply. As a result, the current will flow into the IC to elevate its supply voltage. Hence, the circuit under discussion cannot be operated as an output port having high withstand voltage.

SUMMARY OF THE INVENTION

The present invention has been accomplished under these circumstances and has an object providing a CMOS output circuit that has an enhancement-type PMOS and an enhancement-type NMOS connected in order between a power supply line and a reference potential line and that has the junction between the PMOS and the NMOS connected to an output terminal. The PMOS is such that a P-type region is provided in the back gate region to form a diode, said back gate region being connected to the power supply line via the diode. A switch circuit is inserted between the gate of this PMOS and said junction or the output terminal. When a voltage higher than the voltage on the power supply line is applied to the output terminal, the applied voltage will turn on the switch circuit.

With this arrangement, if a voltage higher than the voltage on the power supply line is applied to the output terminal, the gate of the PMOS is connected to the junction with NMOS, whereupon said high voltage is applied to that gate. As a result, the PMOS is turned off, breaking the electrical connection between the power supply line and the output terminal. At the same time, the diode in the back gate region of the PMOS creates a reverse bias state between the source and the back gate region, thereby cutting off the electrical connection between the drain and the source of the PMOS. As a result, the output circuit under discussion can be connected to the higher voltage than the voltage on the power supply line. If the voltage at the output terminal becomes lower than the supply voltage $V_{DD}$, the switch circuit will turn off, leaving the PMOS to remain in the OFF state.

When using this output circuit to produce a CMOS output, a signal for either one of the two logical values, "H" and low level (hereunder abbreviated as "L"), is applied to the gates of PMOS and NMOS in accordance with the signal of input logical value, whereupon either one of the PMOS and NMOS is turned on whereas the other is turned off in accordance with the input signals. As a result, "H" and "L" signals can be produced in accordance with the input signals. If the output terminal is "H", "L" is applied to the gate of the PMOS to turn it on. If, in this case, the voltage at the output terminal is higher than the voltage on the power supply line, $V_{DD}$, namely, if the voltage on the external output side is higher than the supply voltage, both the source of the PMOS and the anode of the diode are connected to the power supply line, whereby the high voltage at the output terminal is applied to the drain and the back gate region of the PMOS. As a result, the source of the PMOS and the diode are reverse biased, whereupon the source is electrically cut off from the drain and the back gate region. Further, the switch circuit inserted between the gate of the PMOS and the junction with the NMOS or the output terminal is turned on, making the drain equipotential to the gate so that the potential of the back gate becomes substantially equal to that of the gate. Consequently, no channel is formed under the gate. Because of this mechanism, the drain is effectively cut off from the source to prevent a current from flowing back to the power supply line even if the voltage at the output terminal becomes higher than the supply voltage.

When using the output circuit of interest to produce an open drain output, "H" is applied to the gate of the PMOS so that it will be set in the OFF state. One may then apply an input signal for an appropriate logical value to the gate of the NMOS. Since the PMOS is normally OFF, the NMOS will be turned on or off depending upon the input signal, whereby "L" and a high-impedance state can be generated at the output terminal. If the voltage at the output terminal is higher than $V_{DD}$, or the voltage on the power supply line, the output circuit will operate in the same manner as when it is used to produce a CMOS output.

With the output circuit described above, switching between a CMOS output and an open drain output can be effected by changing the signals for logical values to be fed to the gates of the PMOS and the NMOS, so selection between the two outputs can be freely made on a complete product in which the CMOS output circuit is built as an IC.

In a specific case of the above-described switch circuit which is turned on or off depending upon the voltage at the output terminal, an enhancement-type PMOS is provided and a P-type region is provided in the back gate region of this PMOS to form a diode. The back gate region of the PMOS is connected between the power supply line and the gate terminal or between the power supply line and the associated gate region via the diode. Either one of the source and the drain of the PMOS is connected to the gate of the PMOS in the above-described CMOS output circuit while the other is connected to either the junction between the PMOS and the NMOS or the output terminal. The switch circuit of interest is configured in the way just described above. This PMOS based switch circuit is turned on if the voltage at the output terminal exceeds the sum of $V_{DD}$ (the voltage on the power supply line) and Vth (the threshold level voltage) but will remain off in the other cases.

An object, therefore, of the present invention is to provide an output circuit that is capable of selecting between a CMOS output and an open drain output of high withstand voltage after the circuit is completed as an IC.

Another object of the present invention is to provide an output circuit which, after its completion as an IC, is capable of selecting an open drain output that will prevent an external current from flowing into the power supply line even when it is externally supplied with a voltage higher than the supply voltage.

DESCRIPTION OF THE PREFERRED EMBODIMENT

Figure 1:
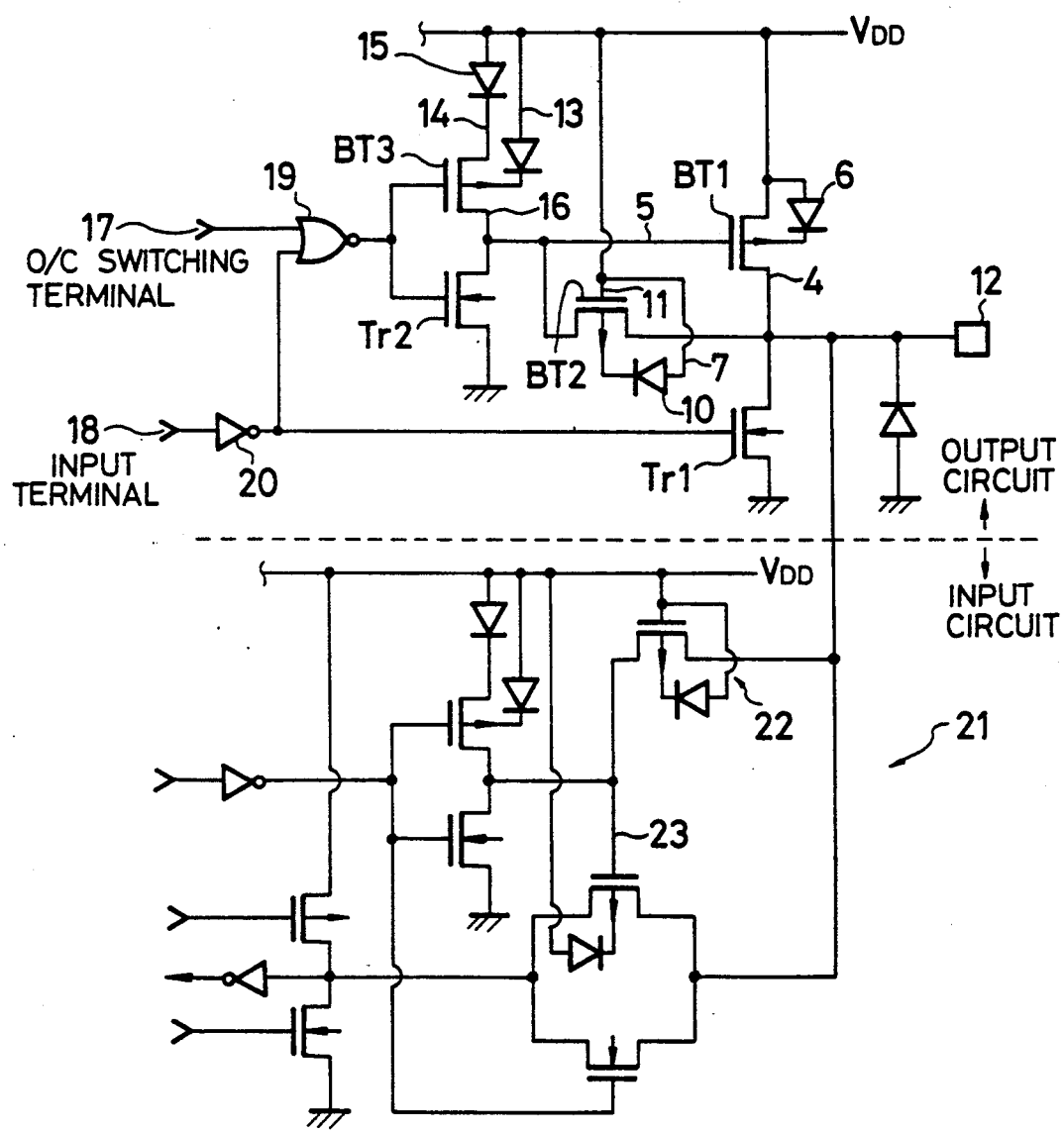
FIG. 1 is a block diagram of an input-output circuit that incorporates the output circuit of the present invention and which is capable of withstanding high voltage.

Shown by $BT_1$ in FIG. 1 is an output enhancement-type PMOS transistor. This transistor combines with another enhancement-type NMOS transistor $Tr_1$ to make up the basic CMOS circuit. For producing an open drain output, transistor $BT_1$ on the power supply side is normally off. In order to insure that the voltage at the output terminal 12 will not raise the IC's supply voltage line $V_{DD}$ even if the former has become higher than the supply voltage $V_{DD}$ (the two supply voltages are indicated by the same symbol) when transistor $BT_1$ is off, the transistor $BT_1$ has the electrical connection shown in FIG. 2, from which the PMOS transistor $BT_2$ shown in FIG. 1 is omitted for the sake of convenience, whereby the output terminal is shown to be directly connected to the gate.

Figure 2A:
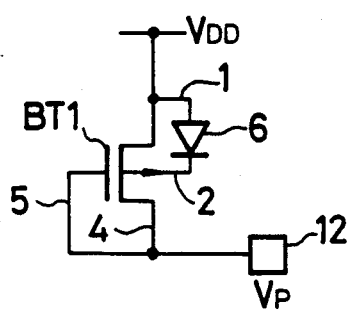
FIGS. 2a-2b schematically a PMOS that has the back gate connected to a power supply line via a diode which is formed in the back gate or well region of the PMOS.
Figure 2B:
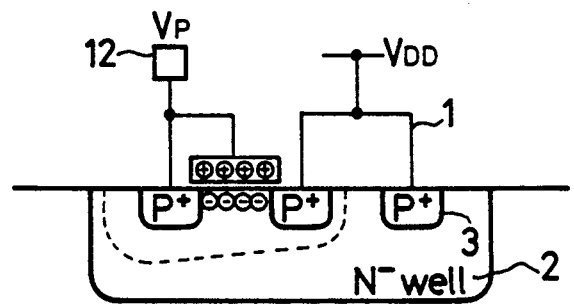

As shown in FIG. 2(b), the PMOS transistor $BT_1$ has P-type regions 3 provided between a back gate bias terminal 1 and an N-well region 2 (back gate region) to form a diode 6 in that region. Then, as shown in FIG. 2(a), the transistor $BT_1$ which is an enhancement-type PMOS is connected to the power supply line via the diode 6 of reverse direction in which the N-well region 2 of $BT_1$ serves as cathode. As a result, when a high voltage is applied to the output terminal 12, causing the voltage at the back gate region (which is hereunder referred to as the "back gate") to become higher than the supply voltage $V_{DD}$, whereupon the diode 6 is reverse biased by the voltage being applied from the back gate to $V_{DD}$. Needless to say, the source which is connected to the power supply line is also reverse biased with respect to the back gate. Further, a drain terminal 4 and a gate terminal 5 are connected equipotentially so as to prevent channelling under the gate, thereby preventing the application of a high voltage from the source to the power supply line $V_{DD}$. As a consequence, the voltage at the output terminal 12 can be increased to a level higher than the supply voltage.

Figure 3A:
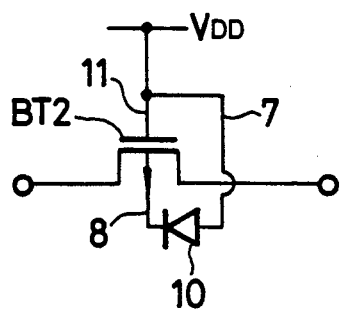
FIGS. 3a-3b schematically the case where a PMOS of the same structure as shown in FIG. 2 is used as a switch circuit.
Figure 3B:
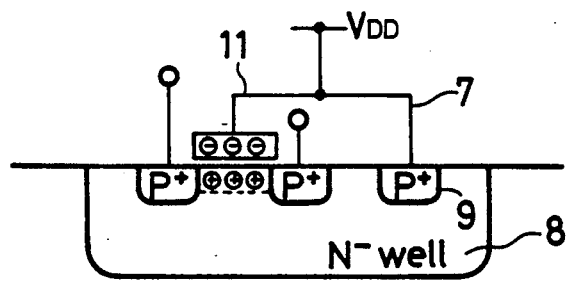
Figure 4:
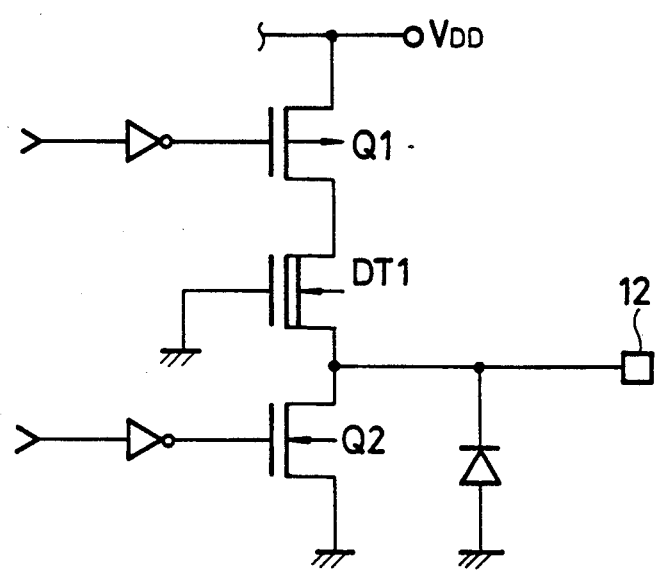
FIG. 4 is a block diagram of a prior art output circuit that is capable of switching between a CMOS output and an N-channel open drain output.

The circuit under discussion, however, has a serious problem if it is just the same as shown in FIG. 2. That is, if the voltage at the output terminal 12 becomes lower than the supply voltage $V_{DD}$, the potential at gate terminal 5 will drop and a channel forms to have a current flow from the power supply line $V_{DD}$ to the output terminal 12. In order to prevent this problem, a switch circuit that is turned on or off depending upon the voltage level at the output terminal is provided in the circuit shown in FIG. 1. This switch circuit is inserted between the drain terminal 4 and the gate terminal 5 shown in FIG. 2. The switch circuit is shown schematically in FIG. 3. As shown in FIG. 3(b), this switch circuit has a P-type region 9 provided between the back gate bias terminal 7 and the N-well region 8 (back gate 8) of an enhancement-type PMOS transistor $BT_2$, whereby a diode 10 that is of the same reverse direction as in the transistor shown in FIG. 2 is formed between the N-well region 8 and the back gate bias terminal 7 as shown in FIG. 3(a). Then, the back gate bias terminal 7 is connected to a gate terminal 11, to which the supply voltage $V_{DD}$ is applied. It should be noted here that, as shown in FIG. 1, either one of the source terminal or the drain terminal of the transistor $BT_2$ is connected to the gate terminal 5 of the transistor $BT_1$ whereas the other is connected to the drain terminal 4 of the transistor $BT_1$.

Having the electrical connection described above, the transistor $BT_2$ is turned on with channelling under the gate when the output terminal 12 is supplied with a voltage higher than the sum of the supply voltage $V_{DD}$ and the threshold level Vth. If the voltage at the output terminal 12 is lower than that sum voltage, the transistor BT₂ remains off. Therefore, if the voltage at the output terminal 12 in FIG. 1 is higher than $V_{DD}+V_{th}$, the transistor BT₂ will conduct, whereby the gate terminal 5 and the drain terminal 4 of the transistor BT₁ will also conduct to prevent a current from flowing from the output terminal 12 back to the power supply. On the other hand, if the voltage at the output terminal 12 is lower than $V_{DD}+V_{th}$, the transistor BT₂ is cut off, whereby the gate terminal 5 of the transistor BT₁ is cut off from the drain terminal 4. As a result, the gate terminal 5 is disconnected from the output terminal 12, thereby preventing the voltage at the gate terminal 5 from becoming lower than $V_{DD}$. Consequently, the transistor BT₁ is maintained in an OFF state.

The output circuit described above can be selectively used to produce a CMOS output or an open drain output even if the voltage at the output terminal 12 is higher than the supply voltage $V_{DD}$.

The circuit shown in FIG. 1 further includes a transistor BT₃ that is also an enhancement-type PMOS and which combines with transistor Tr₂ to make a CMOS inverter. When a CMOS output is selected, the inverter supplies the gate of transistor BT₁ with an output of logical value that is associated with an input signal for the appropriate logical value. When an open drain output is selected, the inverter produces a "H" output, causing the gate of transistor BT₁ to be set at "H" level so that it is held in an OFF state.

The input side of the inverter is connected to an O/C switching terminal (open-drain/CMOS output switching terminal) 17 via a NOR gate 19. The other input of NOR gate 19 receives a signal at an input terminal 18 coming from an inverter 20. The output of the inverter 20 is fed as an input to the gate of transistor Tr₁.

Transistor BT₃ serves to supply "H" to the gate of transistor BT₁ when the voltage at the output terminal 12 in the mode of CMOS output is lower than the supply voltage $V_{DD}$. With this circuit, too, a high potential at the output terminal 12 causes the transistor BT₂ to conduct, whereby the voltage at the drain terminal 16 becomes higher than the supply voltage $V_{DD}$. Hence, as in the case of the circuit shown in FIG. 2, a PMOS is used that has a P-type region provided between the back gate bias terminal 13 and the N-well region to form a diode. The back gate bias terminal 13 is connected to the power supply line $V_{DD}$. Further, the source terminal 14 is connected to the power supply line $V_{DD}$ via a diode 15 of reverse direction. With this arrangement, no current will flow from the drain terminal 16 back to the power supply line $V_{DD}$ even if the voltage at that drain terminal exceeds the supply voltage $V_{DD}$ and this is effective in preventing the unwanted elevation of the supply voltage.

The output circuit under discussion will operate in the following manner. If the mode of operation is to be set for a CMOS output, the O/C switching terminal 17 is adjusted to "L", whereby the output terminal 12 is set for a CMOS output. If, in this state, the input terminal 18 is brought to "L", the voltage at the gate terminals of transistors BT₃ and transistor Tr₂ will both assume the "L" level, whereupon the transistor BT₁ is turned off but the transistor TR₁ receiving the output of the inverter 20 is turned on. As a result, the voltage at the output terminal 12 assumes the "L" level. On the other hand, if the input terminal 18 is brought to "H", the voltages at the gate terminals of transistors BT₃ and Tr₂ will both assume the "H" level, whereupon the transistor BT₁ is turned on but the transistor TR₁ is turned off. As a result, the voltage at the output terminal 12 assumes the "H" level.

In the mode of operation is to be set for an open drain output, the O/C switching terminal 17 is adjusted to "H". In this state, the voltages at the gate terminals of transistors BT₃ and Tr₂ will both assume the "L" level irrespective of the logical value of the input terminal 18, whereupon the transistor BT₁ is turned off. In this way, the output terminal 12 is set for an open drain output. If, in this state, the input terminal 18 is adjusted to "L", the transistor Tr₁ will turn on, whereupon the voltage at the output terminal 12 assumes the "L" level. On the other hand, if the input terminal 18 is brought to "H", the transistor Tr₁ will turn off. As a consequence, the output terminal 12 is brought to a high-impedance state. Further, as will be understood from the description in association with FIGS. 2 and 3, if a voltage higher than the supply voltage $V_{DD}$ is applied to the output terminal 12 with the transistor BT₁ being off, the source and the drain of the transistor are positively disconnected and no current will flow back into the power supply line $V_{DD}$.

While the output circuit of the present invention has been described on the foregoing pages, it should be noted that an input circuit indicated by 21 in the lower half of FIG. 1 may be added to that output circuit so as to construct an input/output circuit. The input circuit 21 is such that a switch circuit 22 constructed as shown in FIG. 3 is inserted between a Pch MOSFET gate terminal 23 of a transmission circuit and the output terminal 12. If the voltage at the output terminal 12 serving as an input terminal is higher than $V_{DD}+V_{th}$, the switch circuit 22 will conduct, making it possible to receive an input signal of high voltage. On the other hand, if the voltage at the output terminal 12 is lower than $V_{DD}+V_{th}$, the switch circuit 22 is cut off, whereupon the circuit under consideration will work as an ordinally input circuit.

The output circuit described above as the preferred embodiment uses a positive power supply. It should, however, be noted that a negative power supply may be used with this output circuit. In this alternative case, the ground side which provides a reference potential will be a positive side, serving as if it were the power supply line in the embodiment. The embodiment relates to the case of using an N-well CMOS but, needless to say, the present invention is also applicable to the case of using a P-well CMOS. In the embodiment, signals for the logical values "H" and "L" are used but, if desired, equivalent signals that correspond to "H" and "L" may be applied to the gates of PMOS and NMOS. Therefore, the inverter used in the embodiment for applying signals of logical values to the gate of transistor BT₁ may be replaced by an inverter of another configuration. Alternatively, the the same inverter may be driven via various logic circuits. Further, the O/C switching signal used in the embodiment may be generated by, for example, a DIP switch.

It should be noted here that the term "back gate region" as used hereinabove and in the claims that follow include not only the back gate region per se but also the area continuous thereto.

What is claimed is:

1. In a CMOS output circuit that has an enhancement-type P-channel MOSFET and an enhancement-type N-channel MOSFET connected in order between a power supply line and a reference potential line and that has the junction between the P-channel MOSFET and the N-channel MOSFET connected to an output terminal, the improvement wherein a P-type region is provided in the back gate region of said P-channel MOSFET to form a diode, said back gate region being connected to the power supply line via said diode, a switch circuit being inserted between the gate of said P-channel MOSFET and either said junction or the output terminal, said switch circuit turning on in response to a voltage that is higher than the voltage on the power supply line and which is applied to said output terminal.

2. An output circuit according to claim 1 which is operated to produce a CMOS output when a signal of a logical value is fed to the gates of said P-channel MOSFET and said N-channel MOSFET and which is operated to produce an open drain output when the gate of said P-channel MOSFET is set to a HIGH level while said N-channel MOSFET is supplied with either a signal of a logical value or a corresponding signal.

3. An output circuit comprising:
 a CMOSFET output circuit that has a first enhancement-type P-channel MOSFET and an enhancement-type N-channel MOSFET connected in order between a power supply line and a reference potential line, with a P-type region being provided in the back gate region of the first P-channel MOSFET to form a diode, said back gate region being connected to the power supply line via said diode; and
 a switch circuit that has a second enhancement-type P-channel MOSFET, with a P-type region being provided in the back gate region of the second P-channel MOSFET to form a diode, said back gate region of the second P-channel MOSFET being connected either between the power supply line and the gate terminal or between the power supply line and the associated gate region via said diode, said switch circuit being inserted between the gate of the first P-channel MOSFET and either said junction or the output terminal and turning on in response to a voltage that is higher than the voltage on the power supply line and which is supplied to said output terminal.

4. An output circuit according to claim 3 which is operated to produce a CMOS output when either a signal of a logical value or a corresponding signal is fed to the gates of the first P-channel MOSFET and said N-channel MOSFET and which is operated to produce an open drain output when the gate of said P-channel MOSFET is set to a HIGH level while said N-channel MOSFET is supplied with a signal of a logical value.

5. An output circuit according to claim 4 wherein said N-channel MOSFET is used as a first N-channel MOSFET which receives at the gate either said input signal of a logical value or said corresponding signal, said output circuit further including a CMOS inverter composed of a third P-channel MOSFET and a second N-channel MOSFET, the gate of said first P-channel MOSFET being connected to the output of said inverter, which inverter receives at the input a signal for switching between a CMOS output and an open drain output.

6. An output circuit according to claim 5 wherein said switching signal causes said inverter to output a signal which, when a CMOS output is selected, sets the gate of the first P-channel MOSFET to a logical value associated with said input signal of a logical value and which, when an open drain output is selected, sets the gate of the first P-channel MOSFET to a HIGH level.

7. An output circuit according to claim 6 wherein said inverter is used as a first inverter, said output circuit further including a NAND gate connected to the input of said first inverter and a second inverter connected to the gate of the first N-channel MOSFET, said second inverter receiving either said input signal of a logical value or said corresponding signal, and said NAND gate receiving both the output of the second inverter and said switching signal.

8. An output circuit according to claim 5 wherein the third P-channel MOSFET has a P-type region provided in its back gate region to form a diode, said back gate region being connected to said power supply line via said diode, and the source of said third P-channel MOSFET being connected to said power supply line via a diode of reverse direction.

9. An output circuit according to claim 3 which has an input circuit connected to the output terminal.

10. An output circuit having a first enhancement-type P-channel MOSFET with the source terminal connected to a power supply line, a first N-channel MOSFET with the drain terminal connected to the drain terminal of the first P-channel MOSFET while the source terminal is grounded, a second enhancement-type P-channel MOSFET with either one of the source terminal and the drain terminal connected to the drain terminal of the first P-channel MOSFET while the other is connected to the gate terminal of the first P-channel MOSFET, with the gate terminal being connected not only to said power supply line but also to the back gate terminal of its own, a diode having the anode connected to the power supply line, a third enhancement-type P-channel MOSFET with the source terminal connected to the cathode of said diode while the drain terminal is connected to the gate terminal of the first P-channel MOSFET, and a second N-channel MOSFET with the drain terminal connected to the drain terminal of said third P-channel MOSFET while the source terminal is grounded, each of the first P-channel MOSFET, the second P-channel MOSFET and the third P-channel MOSFET having a P-type region formed between the back gate terminal and the N-well region, with the back gate terminal of the first P-channel MOSFET being connected to the source terminal whereas the back gate bias terminal of the third P-channel MOSFET is connected to the power supply line, which output circuit is further characterized in that when it is to produce a CMOS output with a LOW level being supplied to the output terminal, the gate terminals of both the third P-channel MOSFET and the second N-channel MOSFET are brought to a LOW level whereas the gate terminal of the first N-channel MOSFET is brought to a HIGH level and for outputting a HIGH level to the output terminal, the gate terminals of both the third P-channel MOSFET and the second N-channel MOSFET are brought to a HIGH level whereas the gate terminal of the first N-channel MOSFET is brought to a LOW level, being further characterized in that when said output circuit is to produce an open drain output with a LOW level being supplied to the output terminal, the gate terminals of both the third P-channel MOSFET and the second N-channel MOSFET are brought to a LOW level whereas the gate terminal of the first N-channel MOSFET is brought to a HIGH level and for producing a HIGH impedance at the output terminal, the gate terminals of both the third P-channel MOSFET and the second N-channel MOSFET are brought to a LOW level whereas the gate terminal of the first N-channel MOSFET is brought to a LOW level.

* * * * *